US 7,135,712 B2

(12) United States Patent
Broer et al.

(10) Patent No.: US 7,135,712 B2
(45) Date of Patent: Nov. 14, 2006

(54) ELECTROLUMINESCENT DEVICE

(75) Inventors: Dirk Jan Broer, Eindhoven (NL); Henricus Franciscus Johannus Jacobus Van Tongeren, Eindhoven (NL); Robert Jan Visser, Menlo Park, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/515,737

(22) PCT Filed: May 20, 2003

(86) PCT No.: PCT/IB03/02156

§ 371 (c)(1),
(2), (4) Date: Nov. 24, 2004

(87) PCT Pub. No.: WO03/103068

PCT Pub. Date: Dec. 11, 2003

(65) Prior Publication Data

US 2005/0179371 A1 Aug. 18, 2005

(30) Foreign Application Priority Data

May 31, 2002 (EP) .................. 02077159

(51) Int. Cl.
*H01L 29/22* (2006.01)
*H01R 13/502* (2006.01)

(52) U.S. Cl. ............... 257/98; 257/98; 257/E31.096; 257/E31.129; 438/690

(58) Field of Classification Search ............. 313/506; 257/98
See application file for complete search history.

(56) References Cited

U.S. PATENT DOCUMENTS

| | | | | | |
|---|---|---|---|---|---|
| 6,008,871 | A | * | 12/1999 | Okumura ................... | 349/61 |
| 6,025,897 | A | | 2/2000 | Weber et al. ............... | 349/96 |
| 6,096,375 | A | * | 8/2000 | Ouderkirk et al. ....... | 427/163.1 |
| 6,124,971 | A | * | 9/2000 | Ouderkirk et al. ......... | 359/487 |
| 6,515,785 | B1 | * | 2/2003 | Cobb et al. ................ | 359/247 |
| 2002/0054260 | A1 | * | 5/2002 | Maeda et al. .............. | 349/117 |
| 2002/0093284 | A1 | * | 7/2002 | Adachi et al. ............. | 313/506 |

FOREIGN PATENT DOCUMENTS

| | | |
|---|---|---|
| EP | 0606940 | 7/1994 |
| EP | 0982605 | 3/2000 |
| WO | WO 9712276 | 4/1997 |
| WO | WO 9738452 | 10/1997 |
| WO | WO 0033129 | 6/2000 |
| WO | WO 0034808 | 6/2000 |

* cited by examiner

OTHER PUBLICATIONS

Q. Wu, I.J. Hodgkinson & A. Lakhtakia, 'Circular polarization filters made of chiral sculptured thin films: experimental and simulation results,' Optical Engineering, 39, 2000, 1863-1868.

*Primary Examiner*—Zandra V. Smith
*Assistant Examiner*—Tsz Kit Chiu

(57) ABSTRACT

An electroluminescent device (13), such as a light emitting diode, which has a light-reflecting surface (10) causing undesirable reflection of ambient light incident on the device is provided with a combination of a reflective circular polarizer (17) and an absorbing circular polarizer (23) to suppress the undesirable reflection of ambient light thus improving the contrast of the device when used under high intensity ambient lighting conditions while maintaining a satisfactory brightness. The reflection band of the reflective circular polarizer regions (17') of the reflective circular polarizer (17) are preferably tuned to the corresponding emission band of the luminescent regions (9') of the electroluminescent device to further increase the contrast of the device while substantially maintaining the same brightness.

20 Claims, 2 Drawing Sheets

ELECTROLUMINESCENT DEVICE

Figure 1:
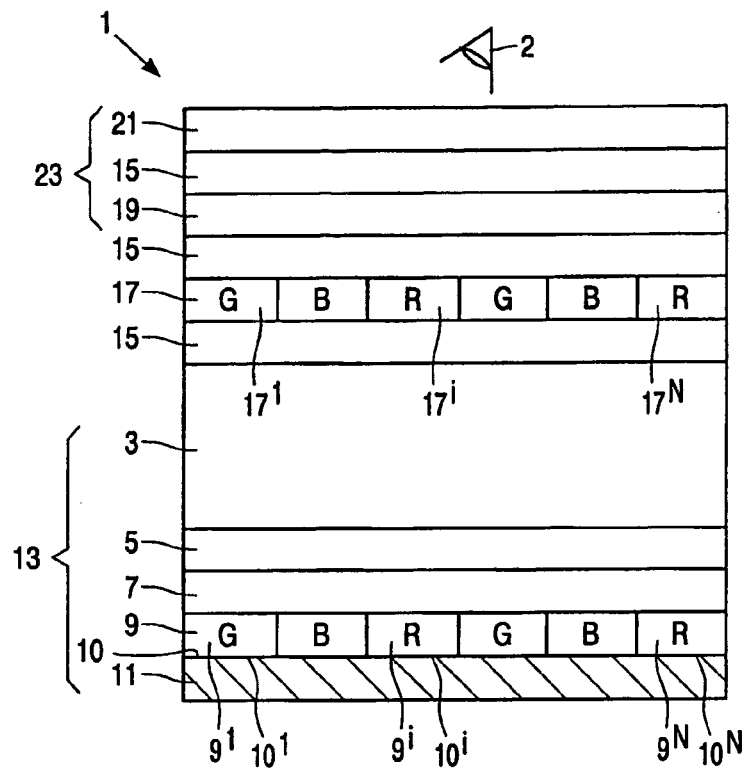

The invention relates to an electroluminescent device.

Electroluminescent (EL) devices are devices which emit light when connected to a voltage source supplying a suitable voltage. Of particular interest are organic electroluminescent devices, or more in particular polymer electroluminescent devices in which the light-emissive layer is made of organic or polymeric material respectively.

Electroluminescent devices are suitable for display, lighting and signage applications. Organic (polymer) electroluminescent devices are in particular suitable if the device is to be thin and/or to emit light across a large surface area.

WO 97/38452 discloses an electroluminescent device in the form of a display. The display has a light-emissive layer and a light-reflecting back electrode. The back electrode reflects ambient light towards the viewer and because such reflected ambient light does not contain any picture information, the contrast of the displayed picture is adversely affected. According to WO 97/38452, in order to avoid such loss of contrast a circular polarizer is arranged in front of the display. The circular polarizer absorbs all ambient light incident on the display, while allowing light emitted by the light-emissive layer to be transmitted thus improving the contrast of the display in particular when ambient light intensity is high.

A disadvantage of the said known display is that the improvement in contrast results in a significantly lower brightness and/or efficiency (if the same brightness is to be achieved the drive current must be increased and thus more power is consumed) of the display because the circular polarizer absorbs about half of the unpolarized light emitted by the light-emissive layer. Such loss of brightness and/or efficiency is unacceptable, in particular when the display is battery-operated.

It is an object of the invention, inter alia, to eliminate or at least mitigate the loss of brightness and/or efficiency caused by the circular polarizer. More particular, it is an object to provide an electroluminescent device which combines a good contrast, even under high ambient lighting conditions, with a satisfactory brightness and/or efficiency.

This object is achieved by means of an electroluminescent device comprising: an electroluminescent layer having luminescent regions i=1 to N, with N>=1, each adapted to emit light within an emission wavelength range $\Delta\lambda_{EL}(i)$;

a light-reflecting surface comprising one or more light-reflecting surface regions arranged, with a light-reflecting side, opposite respective ones of said luminescent regions, the said surface regions being capable of inverting the handedness of a circularly polarized component of light incident on the surface regions;

arranged on a side of the electroluminescent layer facing away from the light-reflecting surface, an absorbing circular polarizer adapted to absorb one circularly polarized light component and transmit the light component orthogonal thereto; and arranged between the absorbing circular polarizer and the electroluminescent layer, a reflective circular polarizer comprising reflective circular polarizer regions i=1, . . . , N, with N>=1, the i-th circular polarizer region being arranged opposite the i-th luminescent region for all i=1 to N, each said circular polarizer region being adapted to reflect, within a reflection wavelength range $\Delta\lambda_{cir}(i)$, the circularly polarized light component the absorbing circular polarizer is adapted to absorb, and transmit the component orthogonal thereto;

wherein the reflection wavelength range $\Delta\lambda_{cir}(i)$ is adapted to overlap with the emission wavelength range $\Delta\lambda_{EL}(i)$ for all i=1 to N.

The term (wavelength) range, also referred to as band, means any set of wavelengths, such as one or more distinct continuous intervals on the real line, and may in general be characterized by a bandwidth and a central wavelength.

The term ambient light refers, in the context of the invention, to any light which does not originate from the device itself but from a source outside the device and which adversely affects the contrast of the light emitted by the electroluminescent device. Which wavelengths have such effect depends on the wavelength range at which the electroluminescent device is designed to operate. The operating range may in principle be any part of the electromagnetic spectrum, in particular including the infrared or ultraviolet range. Typically, however, ambient light refers to light to which the human eye is susceptible, that is the visible range of the spectrum which extends from about 400 to 700 nm. In the context of the present invention it is assumed that the range of wavelengths emitted by the electroluminescent device, $\Delta\lambda_{EL} \equiv \cup_i \Delta\lambda_{EL}(i)$, and thus each range $\Delta\lambda_{EL}(i)$, is a subset (subrange) of the ambient wavelength range.

By arranging a reflective circular polarizer between the luminescent layer and the absorbing circular polarizer, an electroluminescent device which combines a good contrast, even under high ambient lighting conditions, with a satisfactory brightness and/or efficiency is achieved.

The combination of light-reflecting surface, absorbing circular polarizer and reflective circular polarizer has, within a range of overlap of $\Delta\lambda_{cir}(i)$ and $\Delta\lambda_{EL}(i)$, the effect that both circular components of the unpolarized light emitted by the luminescent layer are able to exit the electroluminescent device and reach the viewer, whereas of the ambient light incident on the display only one circular component, viz. the component which has the handedness transmitted by the absorbing and reflective polarizer, is able to reach the viewer. Accordingly, compared to the situation where, in accordance with the prior art, no reflective polarizer but only an absorbing polarizer is present, the brightness of the device has improved, whereas the contrast is maintained, where contrast in this respect is defined as the difference in intensity of emitted light and reflected ambient light.

An electroluminescent device comprising a reflective circular polarizer is known per se from WO 97/12276. The electroluminescent device disclosed therein does not comprise an absorbing circular polarizer and is silent in regard the problem of ambient light reflection which silence is to be expected as the electroluminescent device disclosed in WO 97/12276 is provided in the form of an illumination system. Furthermore, in WO 97/12276 no reference is made to patterned reflective polarizers having distinct reflective circular polarizing regions having mutually different reflection bands to tune the reflection band to the corresponding oppositely arranged luminescent region. The reflective circular polarizers disclosed in WO 97/12276, both narrow band and broad band, may be used in the electroluminescent device in accordance with the invention provided its reflection band overlaps with a luminescent region.

Preferably, in order to further reduce the intensity of reflected ambient light while maintaining brightness, any and, preferably, all reflection bands $\Delta\lambda_{cir}(i)$ are tuned to respective emission wavelength ranges $\Delta\lambda_{EL}(i)$. Accordingly, in a preferred embodiment of the invention, the range $\Delta\lambda_{cir}(i)$ is adapted to be coincident with or a sub-range of the range $\Delta\lambda_{EL}(i)$ for any or, preferably, all i=1 to N. Those skilled in the art will appreciate that in practice the emission spectrum of a luminescent region and the reflection band of a reflective polarizer region have intricate shapes and it will in general not be possible to exactly match the reflection and emission band nor will it be possible to make the reflection band a subrange of an emission band in a strict mathematical sense. Tuning of the reflection band to the emission band may be achieved by narrowing the reflection band(s) of the reflective circular polarizer. Preferred are narrow band circular reflective polarizers having regions wherein the reflection wavelength range $\Delta\lambda_{cir}(i)$ has a bandwidth of 20 to 150 nm, or 40 to 100 nm for any or, preferably, all i=1 to N.

Such narrow band reflective polarizers are conventional and may be manufactured in a simple reliable manner using methods known in the art per se.

For wavelengths outside the reflection bands $\Delta\lambda_{cir}(i)$, the reflective polarizer is inoperative while the light-reflecting surface and the absorbing circular polarizer remain operative. Accordingly, encountering only the light-reflecting surface and the absorbing circular polarizer, both circular components of the ambient light incident on the device are completely absorbed whereas of the emitted light only one circular component is absorbed. Consequently, if the reflection band $\Delta\lambda_{cir}(i)$ of a reflective polarizer region is narrowed by excluding wavelengths at which the corresponding luminescent region does not luminesce, the brightness of that luminescent region is maintained while the intensity of the reflected ambient light is reduced and thus the contrast improved.

Beyond the point where the range $\Delta\lambda_{cir}(i)$ is coincident with $\Delta\lambda_{EL}(i)$, that is at the point where $\Delta\lambda_{cir}(i)$ becomes a sub-range of $\Delta\lambda_{EL}(i)$, the brightness of the luminescent region starts to decrease while the contrast and also the color purity continues to improve. Put differently, if $\Delta\lambda_{cir}(i)$ is a sub-range of $\Delta\lambda_{EL}(i)$, contrast can be exchanged for brightness depending on the requirements of the application in which the electroluminescent device is used demonstrating the versatility of the electroluminescent in accordance with the invention.

If the reflection band is a narrow band (band width for less than 150 nm) or in particular is narrower than the emission band, the reflection band is preferably positioned on the blue (high energy, small wavelength) side of the emission band, that is the central wavelength of reflection band is blue shifted with respect to central wavelength of emission band. The reflection band is viewing angle dependent, the emission band is not. In particular in going from normal to off-normal viewing angles the reflection band becomes red shifted. With the reflection band positioned on the high energy side of the emission band, the reflection band travels through the emission band in going from normal to off-normal viewing angles.

Multi-color and full-color benefit most from the electroluminescent in accordance with the invention. Therefore, in a preferred embodiment, an electroluminescent device comprises a first luminescent region adapted to emit light within an emission wavelength range $\Delta\lambda_{EL}(L)$ corresponding to a first color, a second luminescent region adapted to emit light within an emission wavelength range $\Delta\lambda_{EL}(2)$ corresponding to a second color, and a patterned reflective circular polarizer comprising a first reflective circular polarizer region having a reflection wavelength range $\Delta\lambda_{cir}(1)$ for reflecting light of the first color and a second reflective circular polarizer region having a reflection wavelength range $\Delta\lambda_{cir}(2)$ for reflecting light of the second color.

Of particular interest are full-color electroluminescent devices which comprise, for example, luminescent regions emitting red, green and blue light respectively and a patterned reflective circular polarizer region comprising reflective circular polarizer regions for reflecting red, green and blue light respectively, the luminescent regions being arranged in general in triplets each consisting of a red, a green and a blue luminescent region to form one full-color picture element. As detailed herein below, patterned reflective circular polarizers are known as such.

The light-reflecting surface causes ambient light reflection which is the problem the present invention sets out to solve. An obvious solution would then be to eliminate the light-reflecting layer from the device. However, in doing so the useful purpose of the light-reflecting layer is also lost. For example, the light-reflecting layer helps to direct the light emitted by the luminescent layer, said light emission being in general omni-directional, toward the viewer and thus to increase the brightness and/or efficiency of the device. In many electroluminescent devices, the light-reflecting surface is a surface of a part which is a functional part of the device, for example, the light-reflecting surface may be the surface of an electrode of the electroluminescent device. In such a case integration of parts is achieved.

In a preferred embodiment, the light-reflecting regions correspond to surface regions of electrodes of the electroluminescent device.

Generally, electrodes are required in order to enable the luminescent layer to emit light. This is, for example, the case in organic and polymeric light emitting diodes. Such diodes require electrodes for injecting holes and electrons into the luminescent layer. Integration of functionality is achieved by using the electrode surfaces as the light-reflecting regions. Moreover, as the electrodes are in general very close to the luminescent layer parallax is avoided.

In a particular embodiment, the device comprises a substrate and the reflective circular polarizer is arranged between the said substrate and the luminescent layer.

In order to facilitate manufacture and/or lend mechanical support electroluminescent device generally comprise a substrate. Having to provide mechanical support, the substrate has a thickness which is substantially larger then the other layers of the device. If provided on the side of the light-reflective surface facing from the viewer, the substrate may be silicon substrate the surface of which may also serve as the light-reflecting surface. If the substrate is arranged on the viewing side of the light-reflecting surface the substrate is to be transparent. In order to reduce parallax, it is preferable that the circular reflective polarizer and the luminescent layer are arranged close together which is achieved by arranging the substrate on the viewer side of the circular reflective polarizer instead of between the luminescent layer and the reflective polarizer.

In a preferred embodiment of the invention, any or, preferably, all of the reflective circular polarizer regions comprises cholesteric material having a helicoidal order. Reflective polarizers are known in the art per se. For example in U.S. Pat. No. 6,025,897 a reflective polarizer comprised of a stack of alternating birefringent and isotropic layers is disclosed which is adapted to reflect one component of linearly polarized light and transmit the component orthogonal thereto. Obviously, by arranging the linear reflective linear polarizer between conventional quarter wave retarders a reflective circular polarizer is obtained. A further embodiment of a reflective polarizer may be obtained by deposition of birefringent inorganic materials, such as silicondioxide, on a rotating substrate to form a chiral, twisted columnar layer.

As described above, in multi-color or full-color electroluminescent devices the use of a patterned reflective circular polarizer comprising reflective circular regions having different reflection bands which are each tuned to the corresponding luminescent regions is of particular advantage. Helicoidally ordered cholesteric material is particularly suitable for obtaining such patterned circular reflective polarizers. Such a circular reflective polarizer and a convenient method of manufacturing such a polarizer is for example described in WO 00/34808.

In order to mitigate any viewing angle dependencies introduced by the provision of the reflective circular polarizer, an electroluminescent device in accordance with the invention further comprises, arranged on the side of the reflective circular polarizer facing away from the luminescent layer, a compensation layer having an optical indicatrix complementary to that of the reflective circular polarizer. In case of a cholesteric reflective circular polarizer, the compensation layer has a slow axis along its normal and two equal fast axes in the directions orthogonal to the normal direction.

The invention may be suitably used for any kind of electroluminescent device, including in particular, light emitting chemical cells and mono- charge carrier electroluminescent devices (hole-only, electron-only), such as field emission devices. The invention is of particular use in organic and, more particular, polymeric light emitting diodes as such devices in general comprise a metal electrode which has a specular reflectivity.

The electroluminescent device in accordance with the invention may be used for lighting signage applications, but is particularly suitable for use as a display such as a segmented display or a matrix display of the passive or active type.

These and other aspects of the invention will be apparent from and elucidated with reference to the embodiments described hereinafter.

Figure 2:
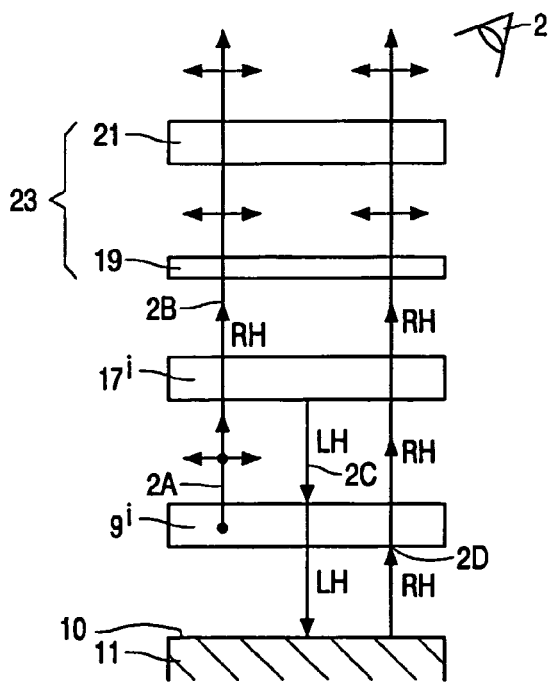
Figure 3:
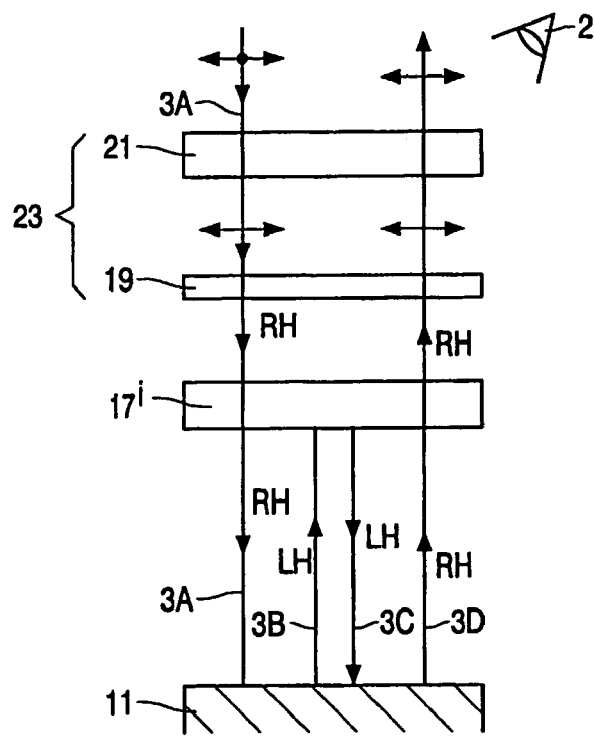
Figure 4:
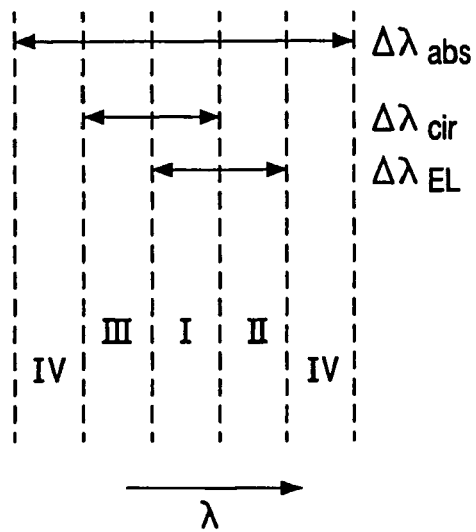

In the drawings:

FIG. 1, schematically, shows, in a cross-sectional view, an embodiment of an electroluminescent device in accordance with the invention, FIG. 2 shows, schematically, a trace of a light ray emitted by the EL device of FIG. 1, FIG. 3 shows, schematically, a trace of an ambient light ray incident on the device of FIG. 1, and FIG. 4 schematically shows, exemplary wavelength ranges of a luminescent region and a reflective circular polarizer region.

FIG. 1, schematically, shows, in a cross-sectional view, an embodiment of an electroluminescent device in accordance with the invention. The electroluminescent device 1 shown in FIG. 1 comprises a conventional polymeric or organic light emitting diode (LED) 13. The use of the polymeric or organic LED 13 is not essential, any other electroluminescent device may be used to illustrate the invention. A LED is particularly suited to illustrate the invention because it comprises in general an electrode which specularly reflects (ambient and emitted) light with high efficiency. The light emitting diode 13 comprises, successively:

a substrate 3 which is at least transparent for the light to be emitted by the LED 13;

a first electrode layer 5 for injecting charges of a first type (either holes or electrons), the electrode layer 5 being transparent for the light to be emitted by the LED 13;

a charge-transport layer 7 for transporting charges of the first type from the electrode layer 5 to the luminescent layer 9;

a luminescent layer 9 comprising luminescent regions $9^i$, i=1 to N adapted to emit light within an emissive wavelength range $\Delta\lambda_{EL}(i)$;

a second electrode layer 11 for injecting charges of a second type (either holes or electrons), the electrode layer 11 being made of metal and having a light-reflecting surface 10 comprising light-reflecting surface regions $10^i$, i=1 to N arranged opposite the luminescent regions $9^i$.

Typically, the substrate 3 is adapted to be impervious to oxygen and/or moisture as in general the active layers of the LED 13 degrade when exposed to oxygen and/or moisture. The substrate material is as such not critical, suitable choices being glass, ceramic or plastic or an alternating stack of plastic and inorganic layers. Typically, the substrate has a thickness of about 0.5 to about 5 mm to provide mechanical support. Being arranged on the side of the electrode layer 5 which faces away from the luminescent layer 9, the substrate allows facilitates easy manufacture. The substrate may alternatively be arranged on the side of the reflective polarizer 17 facing away from the luminescent layer 9. This has the advantage that the reflective polarizer 17 is substantially closer to the luminescent layer 9 and accordingly parallax is reduced. Alternatively, the substrate may be arranged on the side of the light-reflecting surface 10 facing away from the luminescent layer 9 allowing non-transparent substrate materials to be used. A silicon substrate is particularly attractive in this respect as such a substrate allows integration of the electronic circuitry needed to drive the electroluminescent device 1.

The first electrode layer 5 is adapted to inject charges of a first type, which may be holes or electrons, into the luminescent layer 9, in the present embodiment via the charge-transport layer 7. The electrode layer 5 is to be transparent for the light emitted by the LED 13 if it is to reach the viewer 2. A suitable material for the electrode layer 5 is an indiumtinoxide (ITO) but any other conducting transparent material may be used. If combined with conventional luminescent material for use in organic and polymeric light emitting diodes, an ITO electrode layer 5 in general is a hole-injecting electrode also referred to as the anode. Alternatively, the electrode layer 5 may be a transparent electron-injecting electrode layer, materials from which such electrode may be formed being known as such in the art. The electrode layer 5 may be a continuous layer suitable in case the LED 13 is to form a sheet-like back light (for use in e.g. a liquid crystal display) or other large area lighting and signage device. A continuous layer may also be used as a common electrode layer in a segmented light emitting diode display or an active matrix light emitting diode display. Alternatively, the electrode layer 5 may be applied in accordance with a desired pattern in order to present a viewer 2 with a patterned light emission to represent an icon or other fixed picture. Alternatively, the electrode layer 5 may be patterned to form a plurality of independently addressable electrodes which may be suitably used to form a pixelated display such a segmented display or a passive or active matrix display. The electrode layer typically has a thickness of about 50 to 250 nm.

The charge-transport layer 7 is optional and may be formed from conventional materials, poly-ethylenedioxythiophene (PEDOT), poly-aniline and arylamines such as triphenyldiamine (TPD) being typical example in the case of hole-transport layers, oxadiazoles, poly-fluorenes and poly-spiro fluorenes being typical examples of electron-transport materials. The LED 13 may contain further charge-transport layers. In particular such layers may be arranged between the luminescent layer 9 and the second electrode layer 11.

The charge-transport layer 7 typically has a thickness of about 50 to 300 nm if applied using a wet deposition method such as spin coating or ink jet printing or of about 5 to 50 nm if applied using a vapor deposition method.

The luminescent layer 9 is conventional and may be formed in a conventional manner. The luminescent layer 9 may be formed from low molecular weight compound(s) deposited by means of a vapor deposition method, in which case the LED is commonly referred to as organic, or high molecular weight material(s) such as polymer(s) deposited by means of a wet deposition method such as spin coating or ink jet printing. By selecting a suitable luminescent material from which the luminescent layer 9 is formed the emission wavelength range $\Delta\lambda_{EL}(i)$ (simply also referred to as the color) of a particular luminescent region $9^i$ is selected. The luminescent layer 9 may be formed from a continuous layer in which case all luminescent regions $9^i$ have the same emission wavelength range, that is $\Delta\lambda_{EL}(i)=\Delta\lambda_{EL}$ for all i=1 to N, to obtain a monochrome electroluminescent device or the luminescent layer 9 be patterned to comprise luminescent regions $9^i$ of which the color is mutually different to form a multi-color electroluminescent device. If combined with electrode layers 5 and/or 11 comprising individually addressable electrodes multi-color or full-color pixelated displays become available. In this present embodiment, the luminescent layer 9 is partitioned into RGB pixels, each RGB pixel comprising three distinct and individually addressable luminescent regions 9' which emit red (R), green (G) and blue (B) light respectively. The thickness of the luminescent layer is typically about 50 to 500 nm in polymer light emitting diodes and typically about 10 to 100 nm in organic light emitting diodes.

The second electrode layer 11 is adapted to inject charge carriers of a second type, the polarity of the second type being different from the first type. Similar to the first electrode layer 5 (as described supra) the second electrode layer may be provided as a continuous layer or a patterned layer which may or may not comprise individually addressable electrodes.

Because the luminescent layer 9 in general emits light in all directions and thus also in directions pointing away from the viewer 2, the brightness of the LED 13 can be improved in a simple manner by including a light-reflecting surface which redirects light emitted by the luminescent layer 9 towards the viewer 2. Since the electrode layer 11 is required anyway for injecting charges into the luminescent layer 9, and an electrode is preferably made of high-conducting material, such a light-reflecting surface is conveniently implemented if the electrode layer 11 is made of a metal, a metal alloy, a highly doped semiconductor layer or a combination of such layers. In that case, the electrode layer surface 10 serves as a light-reflecting surface. Because electrode material is to be arranged opposite any luminescent region $9^i$ if such region is to emit light luminescence each luminescent region $9^i$ has a light-reflecting surface $10^i$ opposite to it. In case the electrode layer 11 is to inject electrons a low work function metal such as calcium, barium, magnesium, indium or aluminum or an alloy comprising such a metal is required. If the electrode layer is to inject holes a high work function metal may be suitably used such as gold, silver, or aluminum.

Alternatively, in the latter case, a combination of an ITO layer combined with a light-reflecting surface may also be used.

The LED 13 may be manufactured in a conventional manner, for example by providing the substrate 3 in succession with layers 5, 7, 9 and 11.

In operation, a voltage source is connected to the electrode layers 5 and 11 and, if a suitable voltage is applied, electrons and holes are injected into the luminescent layer 9 in which light emission takes place by means of recombination of holes and electrons.

It is readily apparent form FIG. 1 that, if the light emitting diode 13 is used as such, that is without the layers 15 through 23, the light-reflecting surface 10 not only reflects light emitted by the luminescent layer 9 but also reflects ambient light with high efficiency. This reduces the contrast of the electroluminescent device 1 when used under high intensity ambient lighting conditions.

In order to obtain an electroluminescent device which combines a good contrast and brightness even when ambient light of high intensity is incident on the electroluminescent device, the electroluminescent device 1 comprises in succession:

an absorbing circular polarizer 23 which, being formed from a laminate of a quarter lambda wave layer 19 and a dichroic linear polarizer 21, is adapted to absorb one circularly polarized light component and transmit the light component orthogonal thereto; and a reflective circular polarizer 17 comprising reflective circular polarizer regions $17^i$ for i=1, . . . , N, with N>=1, the circular polarizer region $17^i$ being arranged opposite the luminescent region $9^i$ for all i=I to N, each said circular polarizer region $17^i$ being adapted to reflect, within a wavelength range $\Delta\lambda_{cir}(i)$, the circularly polarized light component the absorbing circular polarizer is adapted to absorb, and transmit the component orthogonal thereto, wherein the wavelength range $\Delta\lambda_{cir}(i)$ is adapted to overlap with the range $\Delta\lambda_{EL}(i)$ for all i=1 to N.

The electroluminescent device 1 further comprises adhesive layers 15 to join the LED 13 and the layers 17, 19 and 21 together to obtain an integrated structure. The adhesive may be made of optical glue, optical glues being well known in the art. Although instrumental in reducing parasitic reflections at interfaces between the various layers, the adhesive layer is not essential for the invention. Alternatively, by selecting proper materials, both thermosetting and thermoplastic polymeric material are useful in this respect, and methods of processing such materials, the layers 3, 17, 19, and/or 21 may be firmly joined without adhesive layer.

The quarter wave retarder 19 and the dichroic linear polarizer 21 are both components well known in the art. It is also well established that the combination of a quarter wave retarder and a dichroic linear polarizer provides an absorbing circular polarizer. Typically, the linear polarizer 21 is adapted such that the absorbing circular polarizer is active across the entire wavelength range of the ambient light incident on the electroluminescent device 1.

Reflective circular polarizers are known as such in the art and any one of such known reflective circular polarizers may be suitably used in the EL device in accordance with the invention. Examples of suitable reflective polarizers are summarized in WO 97/12276. A further embodiment of a reflective polarizer may be obtained by deposition of a birefringent inorganic material, such as silicondioxide, on a rotating substrate to form a chiral, twisted columnar layer such as described in Q. Wu, I. J. Hodgkinson & A. Lakhtakia, 'Circular polarization filters made of chiral sculptured thin films: experimental and simulation results,' Optical Engineering, 39, 2000, 1863–1868.

The reflective circular polarizer 17 is patterned to comprise reflective circular polarizer regions $17^i$ where the reflective circular polarizer region $17^i$ is arranged opposite the luminescent region $9^i$. The reflection band $\Delta\lambda_{cir}(i)$ of each of the reflective circular polarizer regions $17^i$ is tuned to the emission band of the corresponding luminescent region $9^i$. Specifically, in the present embodiment, the reflective circular polarizer regions which are opposite the blue-emitting luminescent regions have a reflection band for reflecting blue, those opposite a green-emitting luminescent region have a reflection band for reflecting green light, and those opposite a red-emitting luminescent region have a reflection band for reflecting red light.

Patterned reflective circular polarizers such as the patterned reflective circular polarizer 17 are known as such. For example, WO 00/34808 discloses a patterned reflective circular polarizer formed from helicoidally ordered cholesteric material. Generally, a circular polarizer formed from helicoidally ordered cholesteric material is also known in the art as a cholesteric polarizer or a chiral nematic polarizer. Patterned reflective circular polarizers are also known as cholesteric color filters.

In general, cholesteric (chiral nematic) polarizers are formed from cholesteric (chiral nematic) material which is helicoidally ordered. That is, on a molecular level, the material has a helical symmetry characterized by a helix having a helical axis, a handedness and a pitch. As is well known helicoidally ordered material reflects circularly polarized light having the handedness of the helix and transmits light having the opposite handedness in a wavelength range having a central wavelength $\Delta_{cir}$=n.p and a bandwidth $\Delta\lambda_{cir}$=$\Delta$n.p, where p is the pitch of the helix, n the average refractive index of the cholesteric material and $\Delta$n the birefringence associated with the cholesteric material. Generally, to be useful as a cholesteric polarizer the cholesteric material is provided in the form of a layer and is ordered on a macroscopic level such that within regions $17^i$ the helical axis extends transversely to the layer.

A preferred chiral nematic (cholesteric) reflective circular polarizer is one obtainable by orienting polymerizable or, more specific, photo-polymerizable, liquid crystalline chiral nematic material to obtain a helicoidally ordered (photo)-polymerizable liquid crystalline chiral nematic layer which is then (photo)-polymerized, while maintaining the helicoidal order, to obtain a (photo)-polymerized chiral nematic reflective circular polarizer.

Liquid crystalline chiral nematic compositions which are (photo)-polymerizable are well known in the art (see e.g. WO 00/34808, EP 606940 and EP 982605) and generally comprise a nematic material which, if oriented neat, is capable of forming a uniaxially oriented state characterized by a birefringence $\Delta$n and a chiral compound, which need not be itself liquid crystalline, but if added to the nematic material modifies the nematic material into a material which is capable of forming a cholesteric order. The pitch p of a chiral nematic composition can be adjusted by the type of chiral compound used and the amount in which it is added. The composition, which preferably further contains a photoinitiator to facilitate polymerization, is rendered (photo)-polymerizable by providing the nematic and/or chiral material with (photo)-polymerizable groups such as acrylates. Of particular advantage are crosslinkable chiral nematic compositions. By means of the photo-polymerizable chiral nematic compositions, reflective circular polarizers having a variety of band widths become available in a simple manner and accordingly the band width can be tuned to the emission wavelength range of the luminescent layer 9 which as is explained below of particular advantage to improve the contrast of the electroluminescent device.

Photo-polymerizable chiral nematic compositions are particularly suitable to manufacture patterned cholesteric reflective polarizers such as the polarizer 17.

Several methods exist to manufacture patterned cholesteric reflective polarizers from photo-polymerizable compositions. In a first method, a first cholesteric layer is pattern-wise photo-polymerized, e.g. by means of a mask, to obtain a patterned cholesteric reflective layer having regions with a first reflection band $\Delta\lambda^{cir}(1)$, a second cholesteric layer is pattern-wise photo-polymerized, e.g. by means of a mask, to obtain a second patterned cholesteric reflective layer having regions with a second reflection band $\Delta\lambda^{cir}(2)$, the first and second band being different, and then laminating the first and second cholesteric layer together. The masks are designed such that the first and second regions do not overlap or at least do not completely coincide. In a second method, a single layer of photo-polymerizable chiral nematic composition is pattern-wise photo-polymerized a number of times, each time with a different pattern and each time at a different temperature exploiting the well known fact that the pitch associated with the helicoidal order depends on temperature. In a third method use is made of a photo-polymerizable chiral nematic composition in which the chiral compound has a photo-adjustable helical twisting power, details of which are provided in e.g. WO 00/34808.

An even further improvement on contrast and/or color purity is obtained in an electroluminescent device comprising a reflective circular polarizer having a reflective circular polarizer region which comprises one or more dyes which selectively absorb ambient light outside the reflection wavelength range of the said reflective circular polarizer region. Such reflective circular polarizers are known per se, see WO 00/33129.

When the electroluminescent device 1 is connected, via the electrode layers 5 and 9, to a voltage source and a suitable voltage is applied, holes and electrons are injected into the luminescent layer 9 and by recombination of holes and electrons light photons are produced which exit the device 1 via the substrate 3.

More specifically, referring to FIG. 2, an unpolarized light ray 2A emitted in the direction of the viewer 2 by a luminescent region $9^i$ is incident on the reflective polarizer region $17^i$. The wavelength of emitted light ray 2A being within the reflection band of the reflective polarizer region $17^i$, the unpolarized light ray 2A is split into a transmitted right-handed circularly polarized (RH) light ray 2B and a reflected left-handed circularly polarized (LH) light ray 2C.

In accordance with the invention, the reflective polarizer 17 and the absorbing circular polarizer 23 are transmissive for circularly polarized light of the same handedness. The light ray 2B is therefore transmitted by the absorbing circular polarizer 23 and able to reach the viewer 2, which after having passed the absorbing circular polarizer 23 is linearly polarized.

The left-handed circularly polarized reflected light ray 2C is transmitted by the luminescent region $9^i$ and is then incident on the light-reflecting surface 10. The light-reflecting surface is the surface of a metal electrode layer 5. Because the luminescent layer 9 is very thin, about 100 nm, and is to be very uniform in thickness in order to achieve uniform light emission, the metal surface is very smooth. In fact it is smooth to the extent that it specularly reflects light with high efficiency. It is well known that a specularly reflecting metal surface upon reflection inverts the handedness of circularly polarized light incident thereon. Consequently, upon reflection of the light ray 2C, the reflected light ray is right-handed circularly polarized. As explained above with reference to light ray 2B, right-handed circularly polarized light is transmitted by the reflective and absorbing polarizer to reach the viewer 2. Analogously, light emitted by the luminescent layer 9 which is directed initially towards the light-reflecting surface 10 also reaches the viewer 2. In summary, in the electroluminescent device 1 100% (any light loss caused by non-idealities associated with the components of the device being disregarded) light emitted by the luminescent layer is able to reach the viewer 2.

FIG. 3 shows, schematically, a trace of an ambient light ray incident on the device of FIG. 1. The unpolarized ambient light ray 3A is filtered by the absorbing circular polarizer 23, the left-handed polarization being absorbed and the right-handed polarization being transmitted to produce right-handed (RH) polarized light. As shown by the trace of the light rays 3B, 3C and 3D, the transmitted right-handed light ray 3A is ultimately able to reach the viewer 2. The net effect on ambient light is that 59% of the incident light is absorbed. As the emitted light efficiency is 100% the contrast of the device is improved compared to the situation where the reflective and absorbing circular polarizers are absent.

The intensity of reflected ambient light may be further reduced while maintaining the same level of brightness, and thus the contrast, by tuning any and preferably all ranges $\Delta\lambda^{cir}(i)$ to respective wavelength ranges $\Delta\lambda^{EL}(i)$.

This is illustrated using FIG. 4 and Table 1.

FIG. 4 schematically shows, exemplary wavelength ranges of a luminescent region and a reflective circular polarizer region. A typical active wavelength range of an absorbing circular polarizer is also included.

Table 1 lists the relative amounts of ambient light and emitted light which is able to reach the viewer 2 for the wavelength ranges indicated in FIG. 4.

TABLE 1

|   | ambient light | | emitted light | |
|---|---|---|---|---|
|   | right-handed | left-handed | right-handed | left-handed |
| I | 50% | 0% | 50% | 50% |
| II | 0% | 0% | 50% | 0% |
| III | 50% | 0% | — | — |
| IV | 0% | 0% | — | — |
| V | 50% | 50% | 50% | 50% |

Range V, which corresponds to the situation where both the absorbing polarizer 23 and the reflective circular polarizer 17 are absent, is taken as a reference.

From Table 1 and FIG. 4 it is apparent that the intensity of ambient light can be reduced without affecting the intensity of the emitted light, and thus the contrast improved, by increasing the range IV at the expense of range III, the optimum being that range III vanishes. Referring to FIG. 4, increasing the range IV at the expense of range III amounts to tuning the bandwidth of the reflective polarizer region to that of the luminescent region by making the reflection band substantially coincident with or substantially a sub-range of the emission band. More specifically, in order to improve on the contrast while maintaining the emitted light intensity of a luminescent region $9^i$ at the same level, the corresponding range $\Delta\lambda^{cir}(i)$ is to be adapted to be, at least substantially, coincident with, or be, substantially, a sub-range of the range $\Delta\lambda_{EL}(i)$. Evidently, the more luminescent regions and reflective polarizer regions are so tuned, the more substantial the improvement is, the improvement being optimal if all are so tuned. A manner to achieve the tuning of the reflection band to the emission wavelength band is to narrow the reflection band of the circular reflective polarizer regions to a bandwidth of 20 to 150 nm, or 40 to 100 nm. As explained above, with respect to cholesteric polarizers band narrowing may be achieved using proper selection of the cholesteric material form which the polarizer is formed.

If the reflection band is a narrow band (band width for less than 150 nm) or in particular is narrower than the emission band, the reflection band is preferably positioned on the blue (high energy, small wavelength) side of the emission band. The reflection band is viewing angle dependent, the emission band is not. In particular in going from normal to off-normal viewing angles the reflection band becomes red shifted. With the reflection band positioned on the high energy side of the emission band, the reflection band travels through the emission band in going from normal to off-normal viewing angles.

From Table 1 and FIG. 4 it is furthermore apparent that the balance between the emitted light intensity and contrast may be adjusted by exchanging wavelengths between ranges I and II. In particular, increasing range I at the expense of II increases the emitted light intensity but reduces contrast and vice versa. Put differently, if the reflection band of the reflective polarizer region is made narrower (within the emission wavelength band), contrast improves at the expense of brightness. Making the reflection band narrower also improves the color purity of the luminescent region because, within the reflection band, the emission spectrum relatively sharpens due to the reflective polarizer region, 100% of the emitted light reaching the viewer within and only 50% outside the reflection band.

From Table 1 and FIG. 4 it is also apparent that narrowing the emissive wavelength band of a luminescent region, which may achieved e.g. by using a different luminescent material, improves the contrast. This improvement in contrast is not necessarily obtained at the expense of emitted light intensity. Therefore, the invention is particularly suitable for electroluminescent device which use narrow emissive wavelength bands. Color monochrome multi-color or full-color typically preferably use such narrow emissive wavelength bands. In particular, in electroluminescent displays having independently addressable regions the use of narrow emissive ranges is desirable as these provide a high color purity and saturation.

The absorbing circular polarizer and in particular the reflective circular polarizer 17 is made of optically anisotropic material. The optical anisotropy may be characterized by an optical indicatrix, a three by three matrix whose diagonal elements, when presented in diagonal form, represent the refractive index in three principal mutually orthogonal directions. The optical anisotropy causes the refractive indices experienced by normally and obliquely incident light rays to be different. One result of this is that, for example, the reflection band of the reflective circular polarizer becomes red-shifted under oblique incidence. In display applications such angular dependent optical behavior is known as viewing angle dependency and is considered undesirable. Also, under oblique incidence the contrast may be less.

Viewing angle dependency is mitigated if the electroluminescent device 1 comprises a reflective circular polarizer having a reflective circular polarizer region which comprises one or more dyes which selectively absorb ambient light outside the reflection wavelength range of the said reflective circular polarizer region. Such reflective circular polarizers are known per se, see WO 00/33129.

Viewing angle dependency is further mitigated if the electroluminescent device 1 comprises, arranged on the side of the reflective circular polarizer facing away from the luminescent layer, a compensation layer (not shown) having an optical indicatrix complementary to that of the reflective circular polarizer, in particular in case of a cholesteric reflective circular polarizer, the compensation layer has a fast axis along its normal and two equal slow axes in the directions orthogonal to the normal direction.

Such compensation layers and methods of manufacturing such layers are well known in the art. The known compensation layers can be suitably used in the context of the present invention provided the optical indicatrix is adapted to compensate for the particular reflective circular polarizer of the electroluminescent device 1. For example, a reflective circular polarizer or, more particular a reflective cholesteric polarizer, may be conveniently compensated using a compensation layer comprising homeotropically aligned nematic material such as a polymer or a polymer network.

The invention claimed is:

1. An electroluminescent device comprising:
   an electroluminescent layer having luminescent regions i=1 to N, with N>=1, each adapted to emit light within an emission wavelength range $\Delta\lambda_{EL}(i)$;
   a light-reflecting surface comprising one or more light-reflecting surface regions arranged, with a light-reflecting side, opposite respective ones of the luminescent regions, the surface regions being capable of inverting the handedness of a circularly polarized component of light incident on the surface regions;
   arranged on a side of the electroluminescent layer facing away from the light-reflecting surface, an absorbing circular polarizer adapted to absorb one circularly polarized light component and transmit the light component orthogonal thereto; and
   arranged between the absorbing circular polarizer and the electroluminescent layer, a reflective circular polarizer comprising reflective circular polarizer regions i=1, . . ., N, with N>=1, the i-th circular polarizer region being arranged opposite the i-th luminescent region for all i=1 to N, each circular polarizer region being adapted to reflect, within a reflection wavelength range $\Delta\lambda_{cir}(i)$, the circularly polarized light component the absorbing circular polarizer is adapted to absorb, and transmit the component orthogonal thereto;
   wherein the reflection wavelength range $\Delta\lambda_{cir}(i)$ is a sub-range of the emission wavelength range $\Delta\lambda_{EL}(i)$ for at least one region of the regions i=1 to N.

2. The electroluminescent device of claim 1, wherein the reflection wavelength range $\Delta\lambda_{cir}(i)$ of the at least one region has a bandwidth of 20 to 150 nm.

3. The electroluminescent device of claim 1, including a first luminescent region adapted to emit light within an emission wavelength range $\Delta\lambda_{EL}(1)$ corresponding to a first color, a second luminescent region adapted to emit light within an emission wavelength range $\Delta\lambda_{EL}(2)$ corresponding to a second color, and a patterned reflective circular polarizer comprising a first reflective circular polarizer region having a reflection wavelength range $\Delta\lambda_{cir}(1)$ for reflecting light of the first color and a second reflective circular polarizer region having a reflection wavelength range $\Delta\lambda_{cir}(2)$ for reflecting light of the second color.

4. The electroluminescent device of claim 1, wherein the light-reflecting regions correspond to surface regions of electrodes of the electroluminescent device.

5. The electroluminescent device of claim 1, including a substrate, and wherein the reflective circular polarizer is arranged between the substrate and the luminescent layer.

6. The electroluminescent device of claim 1, wherein at least one reflective circular polarizer region comprises cholesteric material having a helicoidal order.

7. The electroluminescent device of claim 1, including, arranged on the side of the reflective circular polarizer facing away from the luminescent layer, a compensation layer having an optical indicatrix complementary to that of the reflective circular polarizer.

8. The electroluminescent device of claim 1, wherein the electroluminescent device includes an organic or a polymer light emitting diode.

9. The electroluminescent device of claim 1, wherein the reflection wavelength range $\Delta\lambda_{cir}(i)$ of the at least one region has a bandwidth of 40 to 100 nm.

10. The electroluminescent device of claim 1, wherein the reflection wavelength range of the at least one region is substantially narrower than the corresponding emission wavelength range.

11. The electroluminescent device of claim 10, wherein the reflection wavelength range of the at least one region is positioned at a lower wavelength side of the emission wavelength range.

12. The electroluminescent device of claim 1, wherein the reflection wavelength range $\Delta\lambda_{cir}(i)$ is a sub-range of the emission wavelength range $\Delta\lambda_{EL}(i)$ for all of the regions i=1 to N.

13. The electroluminescent device of claim 12, wherein the reflection wavelength range of each of the regions is substantially narrower than the corresponding emission wavelength range.

14. The electroluminescent device of claim 13, wherein the reflection wavelength range of each of the regions is positioned at a lower wavelength side of the corresponding emission wavelength range.

15. The electroluminescent device of claim 12, wherein the reflection wavelength range $\Delta\lambda_{cir}(i)$ of each region has a bandwidth of 20 to 150 nm.

16. The electroluminescent device of claim 12, including a first luminescent region adapted to emit light within an emission wavelength range $\Delta\lambda_{EL}(1)$ corresponding to a first color, a second luminescent region adapted to emit light within an emission wavelength range $\Delta\lambda_{EL}(2)$ corresponding to a second color, and a patterned reflective circular polarizer comprising a first reflective circular polarizer region having a reflection wavelength range $\Delta\lambda_{cir}(1)$ for reflecting light of the first color and a second reflective circular polarizer region having a reflection wavelength range $\Delta\lambda_{cir}(2)$ for reflecting light of the second color.

17. The electroluminescent device of claim 12, wherein the light-reflecting regions correspond to surface regions of electrodes of the electroluminescent device.

18. The electroluminescent device of claim 12, including a substrate, and wherein the reflective circular polarizer is arranged between the substrate and the luminescent layer.

19. The electroluminescent device of claim 12, wherein each reflective circular polarizer region comprises cholesteric material having a helicoidal order.

20. The electroluminescent device of claim 12, wherein the electroluminescent device includes an organic or a polymer light emitting diode.

* * * * *